United States Patent
Kim et al.

(10) Patent No.: US 7,362,867 B1
(45) Date of Patent: Apr. 22, 2008

(54) APPARATUS AND METHOD FOR GENERATING SCRAMBLING CODE IN UMTS MOBILE COMMUNICATION SYSTEM

(75) Inventors: Jae-Yoel Kim, Kunpo-shi (KR); Hee-Won Kang, Seoul (KR)

(73) Assignee: Samsung Electronics Co., Ltd (KR)

(*) Notice: Subject to any disclaimer, the term of this patent is extended or adjusted under 35 U.S.C. 154(b) by 668 days.

(21) Appl. No.: 09/611,518

(22) Filed: Jul. 7, 2000

(30) Foreign Application Priority Data

Jul. 7, 1999 (KR) .............................. 1999-27279

(51) Int. Cl.
*H04K 1/00* (2006.01)
(52) U.S. Cl. ................... 380/275; 380/33; 380/34; 380/47; 380/268; 380/273; 375/150; 375/152
(58) Field of Classification Search ................ 370/335, 370/342; 380/239, 209, 255, 11–15, 219–221, 380/268, 275, 33, 34, 47, 140, 273; 375/155, 375/200, 150, 152
See application file for complete search history.

(56) References Cited

U.S. PATENT DOCUMENTS

| | | | | |
|---|---|---|---|---|
| 3,818,442 | A * | 6/1974 | Solomon ..................... | 714/781 |
| 4,320,513 | A | 3/1982 | Lampert | |
| 4,707,839 | A * | 11/1987 | Andren et al. ............... | 375/150 |
| 5,771,288 | A * | 6/1998 | Dent et al. .................. | 380/270 |
| 6,108,369 | A * | 8/2000 | Ovesjo et al. ............... | 375/146 |
| 6,141,374 | A * | 10/2000 | Burns .......................... | 375/152 |
| 6,339,646 | B1 * | 1/2002 | Dahlman et al. ............ | 380/273 |
| 6,459,722 | B2 * | 10/2002 | Sriram et al. ................ | 375/130 |
| 6,496,474 | B1 * | 12/2002 | Nagatani et al. ............ | 370/208 |
| 6,526,091 | B1 * | 2/2003 | Nystrom et al. ............. | 375/142 |
| 6,542,478 | B1 * | 4/2003 | Park ............................. | 370/308 |
| 6,560,212 | B1 * | 5/2003 | Prasad et al. ................ | 370/335 |

(Continued)

FOREIGN PATENT DOCUMENTS

EP 0 963 070 12/1999

(Continued)

OTHER PUBLICATIONS

European Search Report for EP Appln. No. 00942496.1 dated May 23, 2002.

*Primary Examiner*—Kambiz Zand
*Assistant Examiner*—Carl Colin
(74) *Attorney, Agent, or Firm*—The Farrell Law Firm, PC

(57) ABSTRACT

A scrambling code generating apparatus of a downlink transmitter in a UMTS mobile communication system, which uses one primary scrambling code for separation of base stations and multiple secondary scrambling codes for channel separation. The apparatus includes a first m-sequence generator for generating a first m-sequence and a second m-sequence generator for generating a second m-sequence. A first summer adds the first and second m-sequences to generate the primary scrambling code. A plurality of first masking sections each shift the first m-sequence, and a plurality of second masking sections corresponding to the respective first masking sections each shifts the second m-sequence. A plurality of second summers each adds one of the first shifted m-sequences with the second m-sequence corresponding to the first m-sequence. The output of the second summers thus generates the multiple secondary scrambling codes.

36 Claims, 11 Drawing Sheets

U.S. PATENT DOCUMENTS

| | | | |
|---|---|---|---|
| 6,574,205 B1 * | 6/2003 | Sato .......................... | 370/335 |
| 6,728,305 B2 * | 4/2004 | Ogawa et al. .............. | 375/148 |
| 6,728,411 B2 * | 4/2004 | Bottou et al. ............... | 382/240 |

FOREIGN PATENT DOCUMENTS

| | | |
|---|---|---|
| JP | 59-047833 | 3/1984 |
| WO | WO 9912284 A1 * | 3/1999 |
| WO | WO 99/26369 | 5/1999 |

* cited by examiner

APPARATUS AND METHOD FOR GENERATING SCRAMBLING CODE IN UMTS MOBILE COMMUNICATION SYSTEM

PRIORITY

This application claims priority to an application entitled "Apparatus and Method for Generating Scrambling Code in UMTS Mobile Communication System" filed in the Korean Industrial Property Office on Jul. 7, 1999 and assigned Serial No. 99-27279, the contents of which are hereby incorporated by reference.

BACKGROUND OF THE INVENTION

1. Field of the Invention

The present invention relates generally to an apparatus and method for generating scrambling codes in a mobile communication system, and more particularly, to an apparatus and method for generating a plural scrambling code using masking codes.

2. Description of the Related Art

A code division multiple access mobile communication system (hereinafter, referred to as "CDMA system") uses scrambling codes for the purpose of separating base stations. The European W-CDMA system, UMTS (Universal Mobile Telecommunication System) generates multiple scrambling codes classified into a plural scrambling code group of a predetermined length. As a method for increasing capacity in addition to separation of base stations, which is the objective of using the scrambling codes in the CDMA system, orthogonal codes for multiple scrambling code groups are used to separate channels. That is, when all orthogonal codes for channel separation are used up for a scrambling code group, the mobile communication system may utilize a second scrambling code group to increase the number of available communication links. The UMTS mobile communication system uses a gold sequence with a length of $2^{18}-1$ as scrambling codes in order to have multiple scrambling codes (one primary scrambling code and multiple secondary scrambling code in one base station) constituted by multiple scrambling code groups. The gold sequence with a length of $2^{18}-1$ includes a group of $2^{18}-1$ distinct gold codes. The gold sequences of the same group have a good correlation characteristic with one another. Here, the gold sequence with a length of $2^{18}-1$ is divided into 38400 chips and repeatedly used for scrambling.

Each base station in the UMTS mobile communication systems has a unique scrambling code called "primary scrambling code" that is used to allow terminals to differentiate each base station from other base stations in the system. Also the each unique scrambling code used for spreading (scrambling) downlink channel signals of each base stations is referred to as "primary scrambling code", and one of the scrambling code group used for scrambling downlink data channels in case that an orthogonal codes is not available using the primary scrambling code is called "secondary scrambling code". The base station user its unique primary scrambling codes for spreading(scrambling) common control channel signals transmitted to all mobile stations with corresponding orthogonal code, for spreading (scrambling) data channel signals transmitted to currently communicating mobile stations with corresponding orthogonal codes which are assigned to each of the data channel signals for downlink channel separation. The base station has its unique primary scrambling codes in order for a mobile station to discriminate the base station from adjacent ones. Namely, the number of the primary scrambling codes used must be large enough, e.g., 512 lest that the mobile station should concurrently detect signals of base stations sharing the same primary scrambling codes. Thus the individual adjacent base stations use distinct primary scrambling codes among the 512 primary scrambling codes. When there exists no more orthogonal code with a primary scrambling code to be allocated for channel separation, the individual base station uses secondary scrambling code selected from its multiple secondary scrambling code groups corresponding to the primary scrambling codes used.

An exemplary unit using the multiple scrambling codes is a downlink in the UMTS system. It should be noted that for the purpose of illustration, the term "scrambling code" is interchangeable with the term "gold code" or "gold sequence" indicating the same code as the scrambling code.

FIG. 1 is a schematic diagram showing the structure of a downlink transmitter in the UMTS mobile communication system.

Referring to FIG. 1, upon receiving a dedicated physical control channel DPCCH and dedicated physical data channels DPDCH1, . . . , and DPDCH$_N$, which are previously channel-coded and interleaved, demultiplexers 100-104 (corresponding in number to the number of physical data channels N plus one for the DPCCH) divide the dedicated physical control channel DPCCH and the dedicated physical data channels DPDCH1, . . . , and DPDCHN into I (In-phase) and Q (Quadrature) channels. The I and Q channels separately output from the demultiplexer 101 are fed into multipliers 110 and 111, respectively. The multipliers 110 and 111 multiply the I and Q channels by an orthogonal code 1 for channel separation, respectively, and send the output to a scrambler 120. Similarly, the I and Q channels separately output from the demultiplexers 102 through 104 are subjected to the same operation as described above and fed into N scramblers 124 through 128, respectively. Then, a scrambling code group generator 100 generates secondary scrambling codes corresponding to the scramblers 120, 124 through 128 and outputs them to the corresponding scramblers. Here, the scramblers 120, 124 through 128 multiply the output signals of the corresponding multipliers by the output signals of the scrambling code group generator 100 in a complex mode, to output the real parts of the scrambled signals to a summer 130 and the imaginary parts of the scrambled signals to a summer 135. The summer 130 sums up the real parts of the scrambled signals from the scramblers 120, 124 through 128, while the summer 135 sumps up the imaginary parts.

FIG. 2 is a schematic block diagram of the scrambling code group generator 100 shown in FIG. 1, which concurrently generates multiple scrambling code groups. Although it is the fact that only primary scrambling codes are to be used for common control channels and data channels, secondary scrambling codes may be used in place of the primary scrambling codes to increase the number of available communication links. For example, if base station A uses primary scrambling code B with available orthogonal codes C-H and all of the orthogonal codes C-H have been assigned to various channels, there are no more available orthogonal codes that can be assigned to new channels if a new terminal wants to communicate with base station A. In that case, instead of using primary scrambling code A, secondary scrambling code Z can be used in place of primary scrambling code A for the new channels, and orthogonal codes C-H can then be assigned to the new channels because the new channels use secondary scrambling code Z instead of primary scrambling code A. Thus, the new channels can be differentiated from the original channels that used the m-sequence codes C-H because the new channels use secondary scrambling code Z instead of primary code A. Thus the base station has to be capable of generating multiple scrambling code groups.

Referring to FIG. 2, the normal scrambling code group generator 100 includes a plurality of gold sequence generators 201 and a plurality of delays 203 corresponding to the gold sequence generators 201. Upon receiving control information about the scrambling codes for multiple channels from an upper layer, the gold sequence generators 201 generate scrambling codes, i.e., gold sequence codes based on the control information and output the generated scrambling codes to have an I-channel component. The delays 203 delay the scrambling codes with the I-channel component for a predetermined number of chips and generate delayed scrambling codes having a Q-channel component.

FIG. 3 is a schematic diagram showing the structure of a downlink receiver in the UMTS mobile communication system. For downlink common control channels, the receiver has to descramble the downlink common control signals which have been scrambled with the primary scrambling codes. Simultaneously, for downlink data channels, the receiver also has to descramble the signal scrambled with the secondary scrambling code when the downlink data channel uses secondary scrambling code. Thus the receiver must have a capacity of generating multiple scrambling codes.

Referring to FIG. 3, upon receiving signals from the transmitter as shown in FIGS. 1 and 2, the I- and Q-channel components of the received signals are fed into descramblers 310 and 315, respectively. A scrambling code group generator 300 concurrently generates scrambling codes corresponding to the respective channels and outputs them to the descramblers 310 and 315. Then, the descramblers 310 and 315 multiply the receives signals I+jQ by the conjugates of the scrambling codes received from the scrambling code group generator 300 to descramble the received signals, and then output the I- and Q-channel components of the descrambled signals to corresponding multipliers 320, 322, 324 and 326. Here, orthogonal codes assigned to the respective channels are despread at the multipliers 320, 322, 324 and 326 and output to corresponding demultiplexers 330 and 350. The demultiplexers 330 and 350 demultiplex the despread I- and Q-channel components, respectively.

FIG. 4 is a schematic block diagram of the scrambling code group generator 300 shown in FIG. 3, which concurrently generates multiple scrambling code groups. Although the scrambling code group generator 300 is to use primary scrambling codes for common control channels in fact, it can also use secondary scrambling codes for channels used depending on the users, such as data channels, in case of a lack of available orthogonal codes. Thus the mobile station has to be capable of generating multiple scrambling code groups.

Referring to FIG. 4, the scrambling code group generator 300 of the receiver includes a plurality of gold sequence generators 401 and a plurality of delays 403 corresponding to the gold sequence generators 401. Upon receiving control information about the scrambling codes for multiple channels from an upper layer, the gold sequence generators 401 generate gold sequence codes corresponding to the control information and output the generated gold sequence codes to have an I-channel component. The delays 403 delay the gold sequence codes with the I-channel component for a predetermined number of chips to generate the gold sequence codes of a Q-channel component.

FIG. 5 is a schematic diagram illustrating the structure of the gold sequence generators shown in FIGS. 2 and 4.

Referring to FIG. 5, a gold sequence is normally generated through binary adding to two distinct m-sequences. A shift register that generates the upper m-sequence is implemented with a generator polynomial defined as $f(x)=x^{18}+x^7+1$, and a shift register generating the lower m-sequence is implemented with a generator polynomial defined as $f(x)=x^{18}+x^{10}+x^7+x^3+1$.

In the present UMTS standard specification, there is no description for scrambling code numbering and its generation. Therefore, in the light of the UMTS standard specification the receiver and the transmitter require many scrambling code generators described above to generate multiple scrambling codes and thus uses distinct generators for the individual scrambling codes, which leads to an increase in the hardware complexity. Furthermore, when using gold sequences as the scrambling codes, the hardware complexity may be dependent on the way the scrambling codes are divided into primary and secondary scrambling codes and dependent on how the scrambling codes are numbered.

SUMMARY OF THE INVENTION

It is, therefore, an object of the present invention to provide an apparatus and method for generating scrambling codes grouped in units of a predetermined length using mask functions, thereby minimizing hardware complexity.

It is another object of the present invention to provide an apparatus and method for generating scrambling codes including a primary scrambling code and associated secondary scrambling codes to be used in place of the primary scrambling code to increase the number of available communication links. The scrambling codes are generated by using mask functions. It is further another object of the present invention to provide an apparatus and method generating a primary scrambling code and associated secondary scrambling codes. In an embodiment of the present invention, a first shift register is used to generate a first m sequence and a second shift register is used to generate a second m sequence. The first m sequence is added with the second m sequence to generate a primary scrambling code. To generate the associated second scrambling codes, the bits of the first shift register are entered into N masking sections which use masking functions to cyclically shift the first m sequence. The outputs of each of the masking sections are added with the second m sequence to generate N secondary scrambling codes. It is further another object of the present invention to provide an scrambling codes numbering scheme for simple generation of the scrambling codes by one scrambling code generator.

To achieve the above objects of the present invention, there is provided a method for generating one primary scrambling code assigned to a base station and multiple secondary scrambling codes with two m-sequence generators each having plurality of concatenated shift registers, the method including the steps of: generating a first m-sequence_by first m-sequence generator having a given generation polynomial_and a second m-sequence by second m-sequence generator having a given generation polynomial different from the first m-sequence generation polynomial; adding the output of the first m-sequence generator and the output of the second m-sequence generator to generate first primary scrambling code for generating primary scrambling code; receiving all values of a first m-sequence registers; multiplying the first m-sequence register values with a mask value which is determining secondary scrambling code and summing the multiplied values at every clock signal; and generating i-th secondary scrambling code by adding the summed value and second m-sequence generator's output.

In another aspect of the present invention, there is provided an apparatus for generating multiple scrambling codes in a CDMA mobile communication system, which generates one primary scrambling code assigned to a base station and multiple secondary scrambling codes, the apparatus including: a first m-sequence generator having plurality of serial concatenated shift register for generating a first m-sequence; a second m-sequence generator having plurality of serial concatenated shift register for generating a second m-sequence; a first summer for adding the first and second m-sequences to generate the primary scrambling code; at least a masking sections for receiving each of the first m-sequence generator's register values ($a_i$), multiplying the register values and mask values ($k_i$) which is determining secondary scrambling code by shifting the first m-sequence and summing the multiplied values ($a_i \times k_i$); adding the second m-sequence with the summed values to generate the secondary scrambling code. In further another aspect of the present invention, there is provided a scrambling code generating apparatus of a downlink transmitter in a UMTS mobile communication system, which uses one primary scrambling code for separation of base stations and multiple secondary scrambling codes for channel separation, the apparatus including: a first m-sequence generator for generating a first m-sequence; a second m-sequence generator for generating a second m-sequence; a first summer for adding the first and second m-sequences to generate the primary scrambling code; a plurality of masking sections, each of the first masking sections for shifting the first m-sequence; and a plurality of second summers, each of the second summers for adding one of the shifted first m-sequences with the second m-sequence, the output of the second summers generating the multiple secondary scrambling codes.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described below with reference to the accompanying drawings. In the following description, well-known functions or constructions are not described in detail since they would obscure the invention in unnecessary detail.

A gold code used herein as a scrambling code is generated through binary adding of two distinct m-sequences. Assuming that the two m-sequences each having a length L are defined as m1(t) and m2(t), respectively, a set of gold codes may comprise L distinct gold sequences with good correlation characteristic with one another. The set of gold codes can be expressed by Equation 1.

Equation 1

$G = <m_1(t+\tau) + m_2(t) | 0 \leq \tau \leq L-1>$ where, t is a time variable number and $\tau$ is shift value. As understood from Equation 1, the set of gold codes is a set of all sequences that comprises the sum of the m-sequence $m_1(t)$ cyclically shifted $\tau$ times and the m-sequence $m_2(t)$. Thus, for the purpose of the present invention, the sum of the m-sequence $m_1(t)$ cyclically shifted $\tau$ time and the m-sequence $m_2(t)$ will be designated as a gold code $g_\tau$. That is, $g_\tau(t) = m_1(t+\tau) + m_2(t)$. If the period of the gold code is $2^{18}-1$, then the individual m-sequences constituting the gold code also have a period of $2^{18}-1$. Thus the m-sequence $m_1(t)$ can be cyclically shifted a maximum of $2^{18}-1$ times and the number of elements in the set of the gold codes is equal to $2^{18}-1$, which is the maximum value of the cyclic shift.

The set of gold codes used in the embodiments of the present invention has $2^{18}-1$ gold codes as elements each of which comprises an m-sequence $m_1(t)$ having a generator polynomial defined as $f(x)=x^{18}+x^7+1$ and an m-sequence $m_2(t)$ with a generator polynomial defined as $f(x)=x^{18}+x^{10}+x^7+x^5+1$.

Another m-sequence $m_1(t)$ cyclically shifted $\tau$ times can be obtained by applying mask functions to the memory values of a shift register generating the original m-sequence.

The embodiments of the present invention provide a generator for concurrently generating multiple gold sequences using the mask functions, and a method for efficiently dividing the set of gold sequences into a primary scrambling code set and a secondary scrambling code set to reduce the number of mask functions stored in the memory.

First Embodiment

Figure 1:
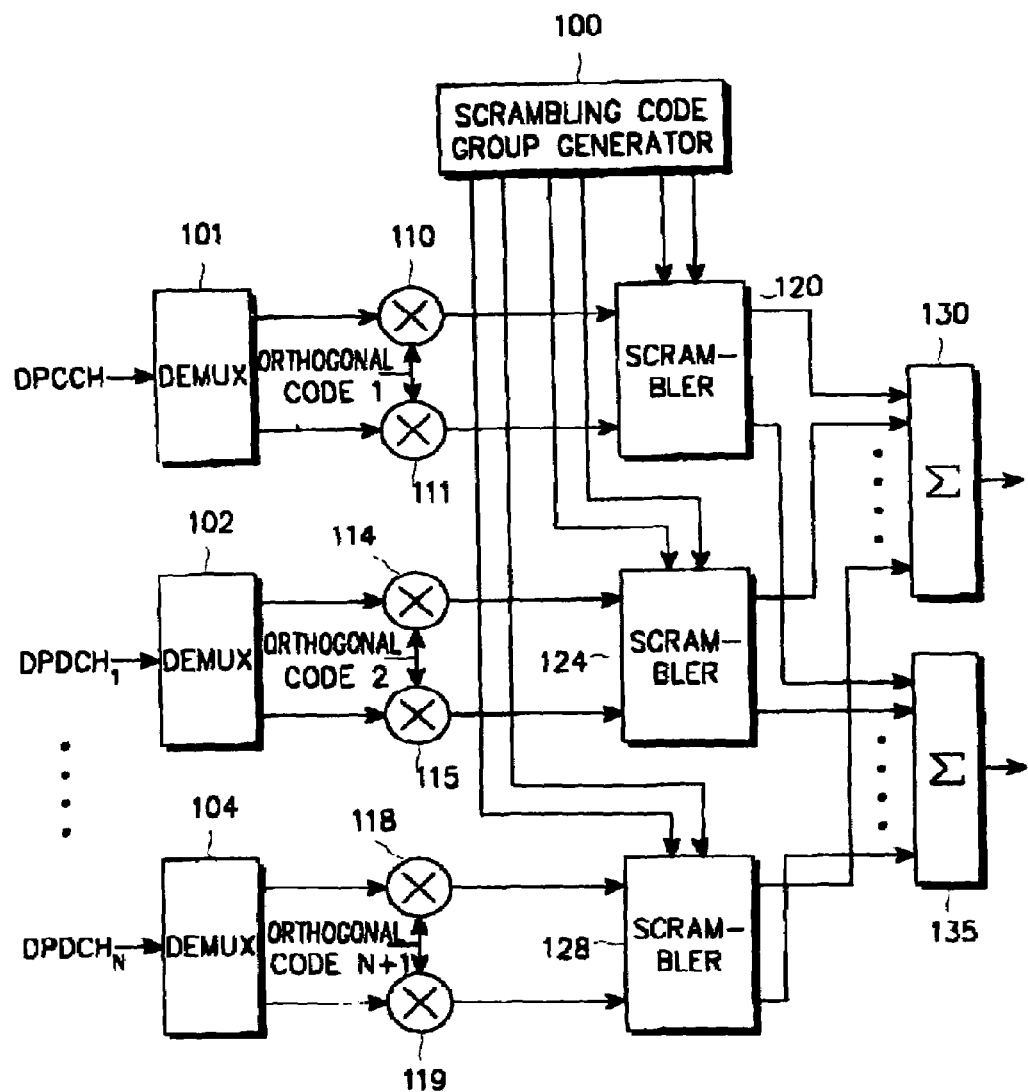
FIG. 1 is a schematic diagram showing the structure of a known downlink transmitter in a general UMTS mobile communication system.
Figure 2:
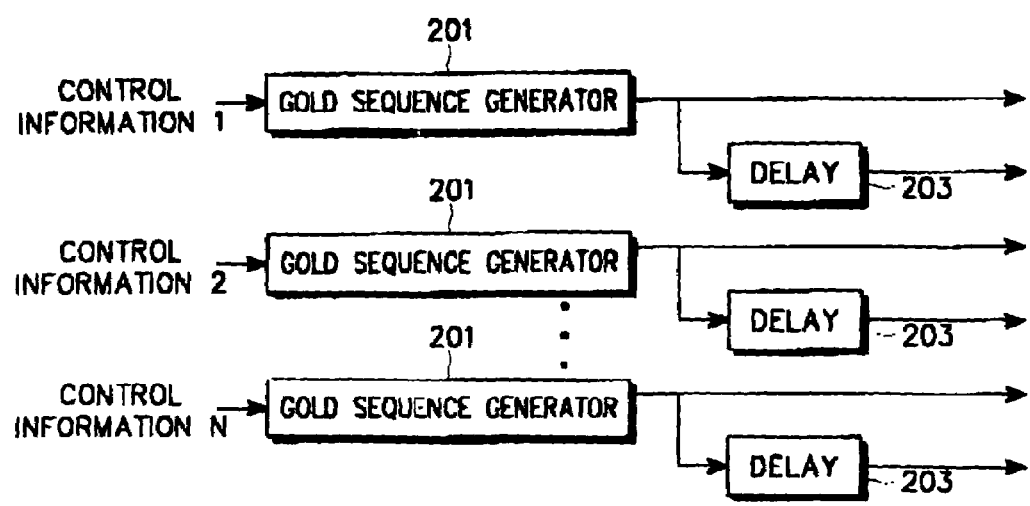
FIG. 2 is a schematic block diagram of a known scrambling code group generator shown in FIG. 1.
Figure 3:
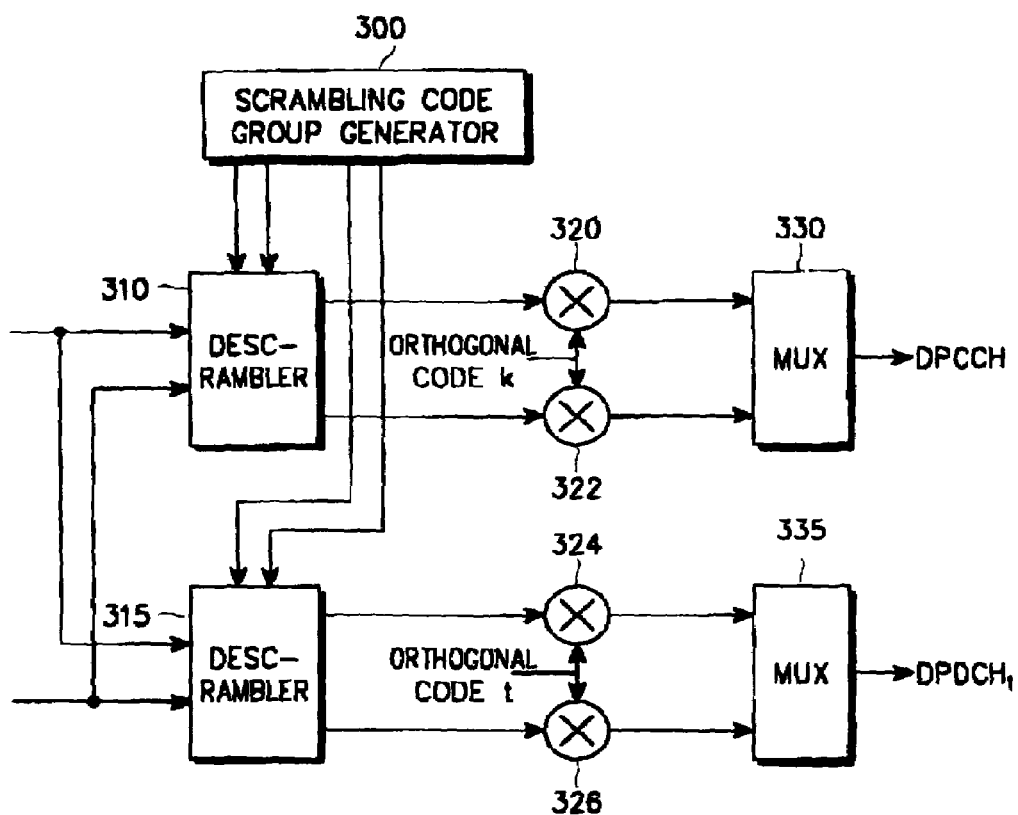
FIG. 3 is a schematic block diagram showing the structure of a known downlink receiver in the general UMTS mobile communication system.
Figure 4:
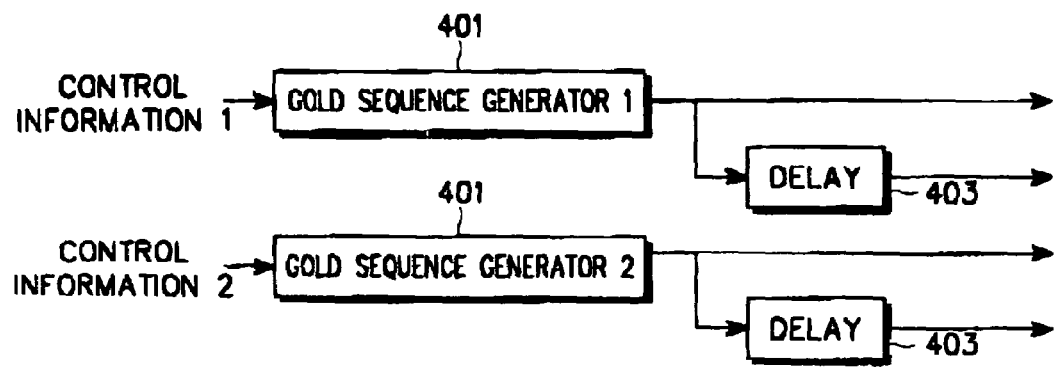
FIG. 4 is a schematic block diagram of a known scrambling code group generator shown in FIG. 3.
Figure 5:
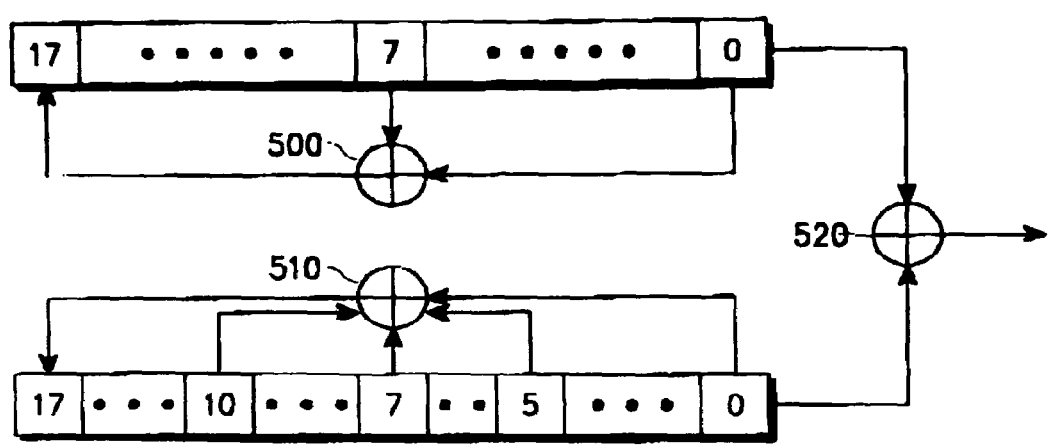
FIG. 5 is a detailed diagram showing the structure of a known scrambling gold group generator in the general UMTS mobile communication system.
Figure 6:
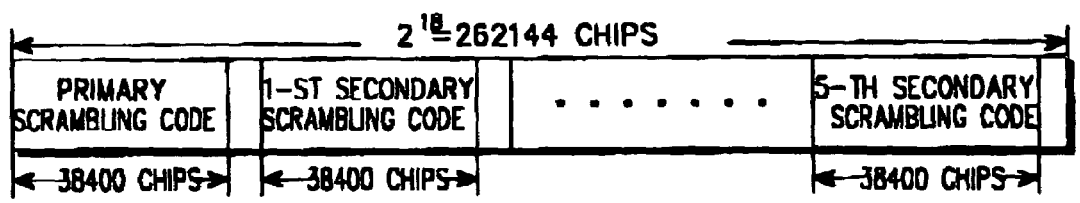
FIG. 6 is a diagram showing the structure of a scrambling code in accordance with a first embodiment of the present invention.

FIG. 6 is a diagram showing the structure of primary and secondary scrambling codes in accordance with a first embodiment of the present invention.

First, when a gold sequence is selected from $2^{18}-1$ length gold sequences, the first 38400 chips are used as a primary scrambling code, the second 38400 chips a first secondary scrambling code corresponding to the primary scrambling code, the third 38400 chips a second secondary scrambling code corresponding to the primary scrambling code, the fourth 38400 chips a third secondary scrambling code corresponding the primary scrambling code, the fifth 38400 chips a fourth secondary scrambling code corresponding to the primary scrambling code, the sixth 38400 chips a fifth secondary scrambling code corresponding to the primary scrambling code. Here, when 512 primary scrambling codes are used, there are five groups of secondary scrambling codes corresponding to the 512 primary scrambling codes. Specifically, $2^{18}-1$ (the length of scrambling codes) divided by 38400 is equal to six (scrambling code groups). Out of six m-sequence code groups, the first scrambling code group is used as primary scrambling codes and the remaining five scrambling code groups are used as secondary scrambling codes. In this structure, if a cell (base station) uses its own primary scrambling code and secondary scrambling codes selected out of its own secondary scrambling codes group, then the selected secondary scrambling codes belonging to the secondary scrambling code group corresponding to the primary scrambling code will be used for downlink channel scrambling codes when orthogonal codes are not available with the primary scrambling code. As shown in FIG. 6, once a primary scrambling code is selected, the secondary scrambling codes corresponding to the primary scrambling code are also part of a gold code which also includes the primary scrambling code. Here, the secondary scrambling codes are generated through application of mask functions to the primary scrambling codes. This method is adapted to a scrambling code group generator of a transmitter as illustrated in FIG. 7, which concurrently generates one primary scrambling code and multiple secondary scrambling codes.

Figure 7:
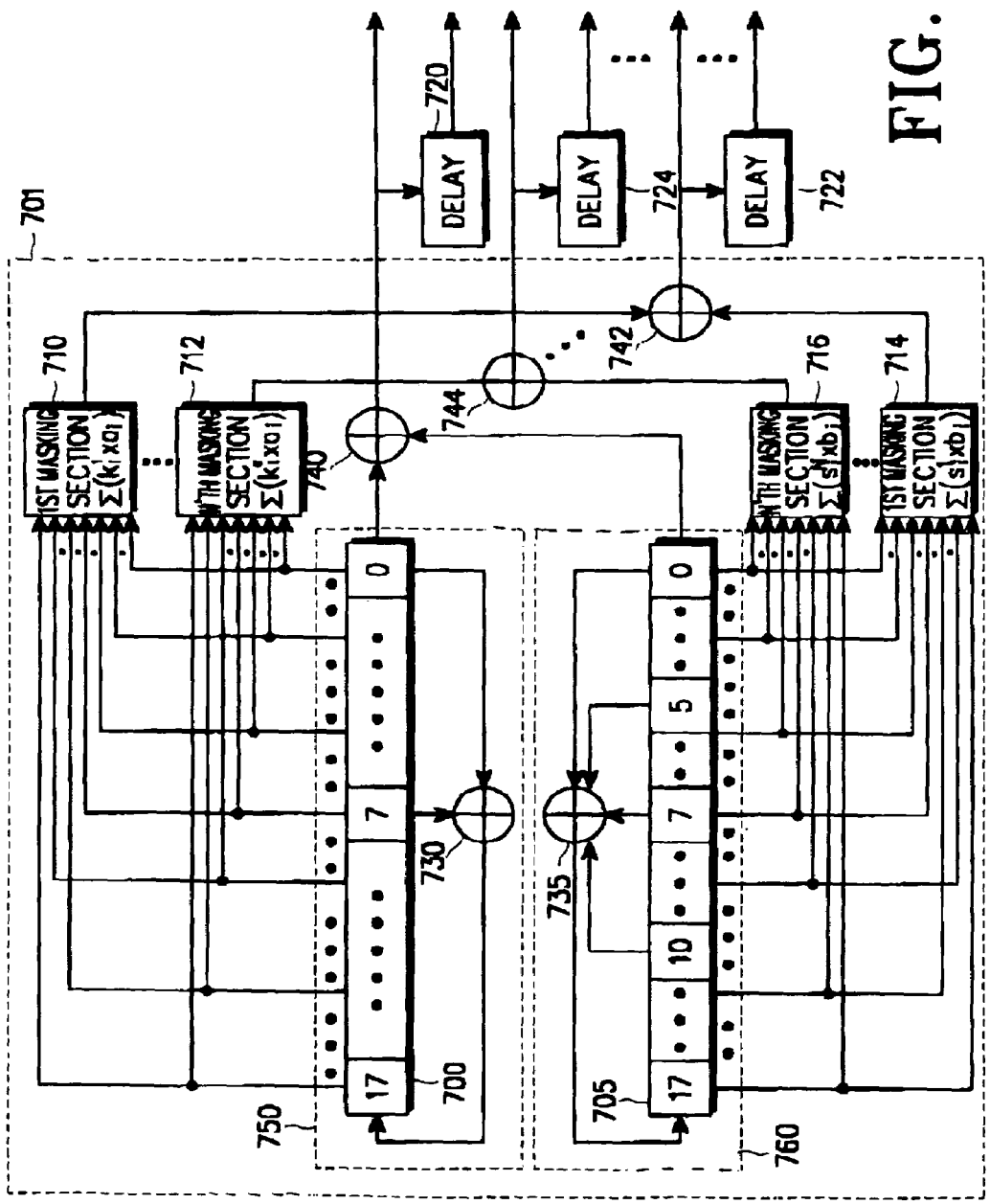
FIG. 7 is a detailed diagram showing the structure of a scrambling code group generator of a downlink transmitter in a UMTS mobile communication system in accordance with the first embodiment of the present invention.

Referring to FIG. 7, the scrambling code group generator 701 comprises a first m-sequence generator 750 including: an upper shift register memory (hereinafter, referred to as "first shift register memory") 700 (with registers 0 to 17) and an adder 730, a second m-sequence generator 760 including; a lower shift register memory (hereinafter, referred to as "second shift register memory") 705 (with registers 0 to 17) and an adder 735, a plurality of masking sections 710 to 712, 714 to 716, a plurality of adders 742 to 744 and 740, and a plurality of delays 722 to 724 and 720. The first shift register memory 700 stores a predetermined register initial value "$a_0$" and the second shift register memory 705 stores a predetermined register initial value "$b_0$". The values stored in each of the registers in the memory 700 and the memory 705 may change during every period of an input clock (not shown). The register memory 700 and 705 store 18 bit (or symbol) binary values "$a_i$" and "$b_i$", respectively (i=0 to c−1 where c=the total number of registers in the register memories 700 and 705).

The first m-sequence generator 750 generates a first m-sequence using the register memory 700 and the adder 730 which is a binary adder that adds the binary values from the registers 0 and 7 of the register memory 700 and outputs the sum into the register 17. The register 0 of the register memory 700 sequentially outputs binary values that form the first m-sequence during every period of the input clock. The masking sections 710 to 712 store mask code values ($k^1_i$ to $k^N_i$) for generating cyclical shifts of the first m-sequence by a predetermined number of chips. The cyclical shifts are achieved by multiplying the mask code values by the register value "$a_i$" of the first shift register memory 700, as expressed by the following equation: $\Sigma(k^L_i \times a_i)$ (L=1 to N). The resulting values are provided to the adders 742 to 744, respectively.

The second m-sequence generator 760 generates a second m-sequence using the register memory 705 and the adder 735 which is binary adder that adds the binary values from the registers 0, 5, 7 and 10 of the register memory 705 and outputs the sum into the register 17. The register 0 of the register memory 705 sequentially outputs binary values that form the second m-sequence during every period of the input clock. The masking sections 714 to 716 store each mask code values ($s^1_i$ to $s^N_i$) for generating cyclical shifts of the second m-sequence by a predetermined number of chips. The cyclical shifts are achieved by multiplying the mask code values by the register value "$b_i$" of the second shift register memory 705. The resulting values are provided to the adders 742 to 744, respectively. Each of the m-sequence generators 750 and 760 generates an m-sequence according to the corresponding generator polynomial.

The adder 740 adds the 0-th register values_(i.e., the last bits) of the first and second shift register memories 700 and 705 to generate a scrambling code, which becomes the primary scrambling code. The adders 742 to 744 add one bit generated from each of the masking sections 710 to 712 connected to the first shift register memory 700 to one bit generated from the masking sections 714 to 716 corresponding to the masking sections 710 to 712, respectively. In other words, the output from the first masking section 710 from the first group is added with the output from the first masking section 714 from the second group and so on, until the output from the N-th masking section 712 from the first group is added with the output from the N-th masking section 716 from the second group. Thus, each of the masking sections 710-712 in the first group has a corresponding masking section in the masking section s 714-716 of the second group. The outputs from the corresponding masking sections are added together in the adders 742-744, respectively. That is, the individual masking sections have a conjugate on a one-to-one basis with respect to the first and second shift register memories 700 and 705. For example, the first masking section 710 of the first shift register memory 700 corresponds to the first masking section 714 of the second shift register memory 705, the N-th masking section 712 corresponding to the N-th masking section 716, and so on. Between the two conjugate masking sections (i.e., first masking sections 710 and 714, or N-th masking sections 712 and 716) is connected the adder 742 to 744 that add the two bits output from the masking sections in response to the input block. Here, the output signals of the summers 742 to 744 have an I-channel component.

The delay 722 to 724 and 720 delay the I-channel signals for a predetermined number of chips to generate respective Q-channel signals.

Now, a description will be given to an operation of the present invention as constructed above.

Once an initial value for the primary scrambling code is applied to the first and second shift register memories 700 and 705 each having 18 registers for cyclically shifting the register value "$a_i$" or "$b_i$", the 0-th register values of the first and second shift register memories 700 and 705 are fed into the adder 740 and the 18 register values "$a_i$" of the first shift register memory 700 are fed into the first to N-th masking sections 710 to 712 in order to generate cyclically shifted sequences of the first shift registers. Meanwhile, the 18 register values "$b_i$" of the second shift register memory 705 are fed into the first to N-th masking sections 714 to 716 in order to generate cyclically shifted sequences of the first shift registers. Then, the first masking section 710 masks the input values from the first (upper) shift register memory 700 (all 18 bits from 18 registers in the shift register memory 700) with a mask function $k^1_i$ (i.e., $\Sigma(k^1_i \times a_i)$) and outputs the masked values to the summer 744 for generating the first secondary scrambling code. The masking is concurrently processing in every masking sections 710-712. The N-th masking section 712 masks the input values from the first (upper) shift registers with a mask function $k^N_i$ (i.e., $\Sigma(k^N_i \times a_i)$) and outputs the masked values to the summer 742 for generating the N-th secondary scrambling code. The N-th masking section 716 masks the input values from the second (lower) shift registers with a mask function $s^N_i$ (i.e., $\Sigma(s^N_i \times a_i)$) and outputs the masked values to the summer 744 for generating the N-th secondary scrambling code. The first masking section 714 masks the input values from the register memory 705 with a mask function $s^1_i$ (i.e., $\Sigma(s^1_i \times a_i)$) and outputs the resulting values to the adder 742 for generating the first secondary scrambling code. Each of the masking sections 710-712 masks the input values from the first shift register memory 700 and outputs the masked value to the respective adders 742-744. Then, the adder 740 adds the output bits from the 0-th registers of the first and second shift register memories 700 and 705. These generated output signals are immediately delayed at the delay 720. The adder 744 adds the output bits from the N-th masking sections 712 and 716 fed to generate I-channel signals, which are immediately fed into the delay 724. The delay 722 delays the I-channel signals output from the adder 742 for a predetermined number of chips to generate Q-channel scrambling signals. The adder 742 adds the output bits from the first masking sections 710 and 714 to generate I-channel signals. These I-channel signals are immediately delayed for a predetermined number of chips at the delay 722. Then, the 0-th and seventh register values of the first shift register memory 700 are added at the summer 730 and the added value is inputted to the seventeenth register, as the left-sided values are shifted to the right side by one and the utmost left-sided register is newly filled with the output value of the summer 730. The 0-th, fifth, seventh, and tenth register values of the second shift register memory 705 are added at the adder 735, the added value is inputted into the seventeenth register, as the left-sided values are shifted to the right side by one and the utmost left-sided register (i.e., the seventeenth register) with the output value of the summer 735. This procedure is repeated to generate multiple scrambling codes.

Figure 8:
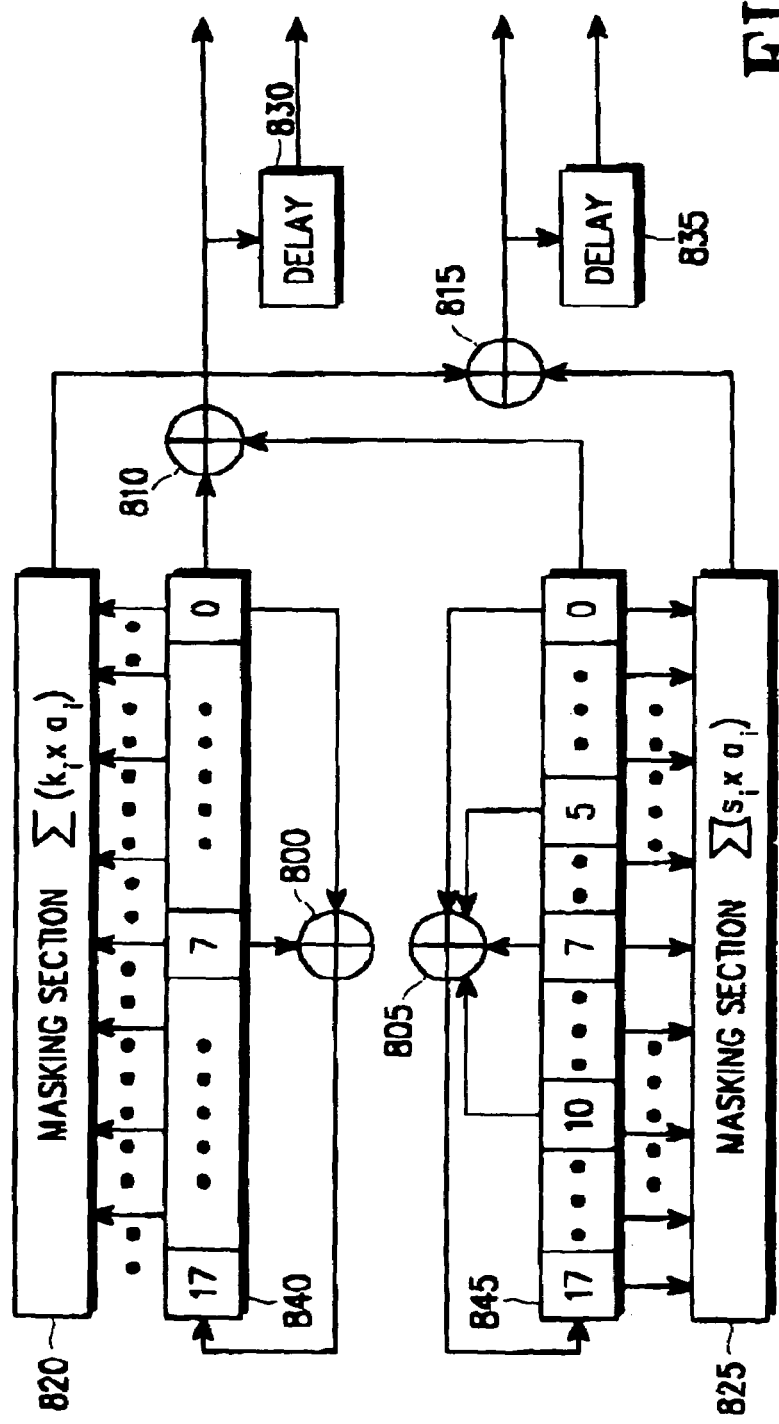
FIG. 8 is a detailed diagram showing the structure of a scrambling code group generator of a downlink receiver in a UMTS mobile communication system in accordance with the first embodiment of the present invention.

FIG. 8 is a diagram showing a scrambling code generator of a receiver for concurrently generating one primary scrambling code and one secondary scrambling code. The receiver has only to use scrambling codes for a common control channel and a data channel assigned thereto and thus needs one primary scrambling code and one secondary scrambling code.

Referring to FIG. 8, once an initial value for the primary scrambling code is applied to a first shift register 840 having 18 upper shift registers and a second shift register memory 845 with 18 lower shifter register, the 0-th register values of the first and second shift register memories 840 and 845 are fed into an adder 810. The output of the adder 810 is a primary scrambling code. The 18 register values "$a_i$" of the first shift register memory 840 are fed into a masking section 820. Meanwhile, the 18 register values "$b_i$" of the second shift register memory 845 are fed into a masking section 825. Then, the masking section 820 masks the input values from the first shift register with a mask function $k_i$ (i.e., $\Sigma(k_i \times a_i)$) and outputs the masked values to an adder 815 for generating the first secondary scrambling code. The masking section 825 masks the input values from the second (lower) shift register with a mask function $s_i$ (i.e., $\Sigma(s_i \times a_i)$) and outputs the masked values to an summer 815 for generating the secondary scrambling code. Then, the adder 810 adds the output bits from the 0-th registers of the first and second shift register memories 800 and 805 to generate I-channel primary scrambling code signals. These I-channel primary scrambling code signals are immediately delayed for a predetermined number of chips at a delay 830 to generate Q-channel primary scrambling code signals. The adder 815 adds the output bits from the masking sections 820 and 825 to generate I-channel primary scrambling code signals, which are immediately delayed at a delay 835. Then, the 0-th and seventh register values of the first shift registers are added at the adder 800, and the added value is output to the seventeenth register, as the left-sided values are shifted to the right side by one. The 0-th, fifth, seventh and tenth register values of the second shift registers are added at the adder 805, and the added value is output to seventeenth register, as the left-sided values are shifted to the right side by one. This procedure is repeated to generate multiple scrambling codes.

The scrambling code generator of the first embodiment needs plurality of distinct mask functions stored in the masking sections in order to generate each secondary scrambling code, i.e., it uses 2N mask functions to generate N scrambling codes. Accordingly, the structure of primary and secondary scrambling codes shown in FIG. 6 enables implementation of the scrambling code generator of the transceiver structure shown in FIG. 7 or 8, which further includes only 2N mask functions with a quite little hardware complexity to generate multiple scrambling codes.

Second Embodiment

Figure 9:
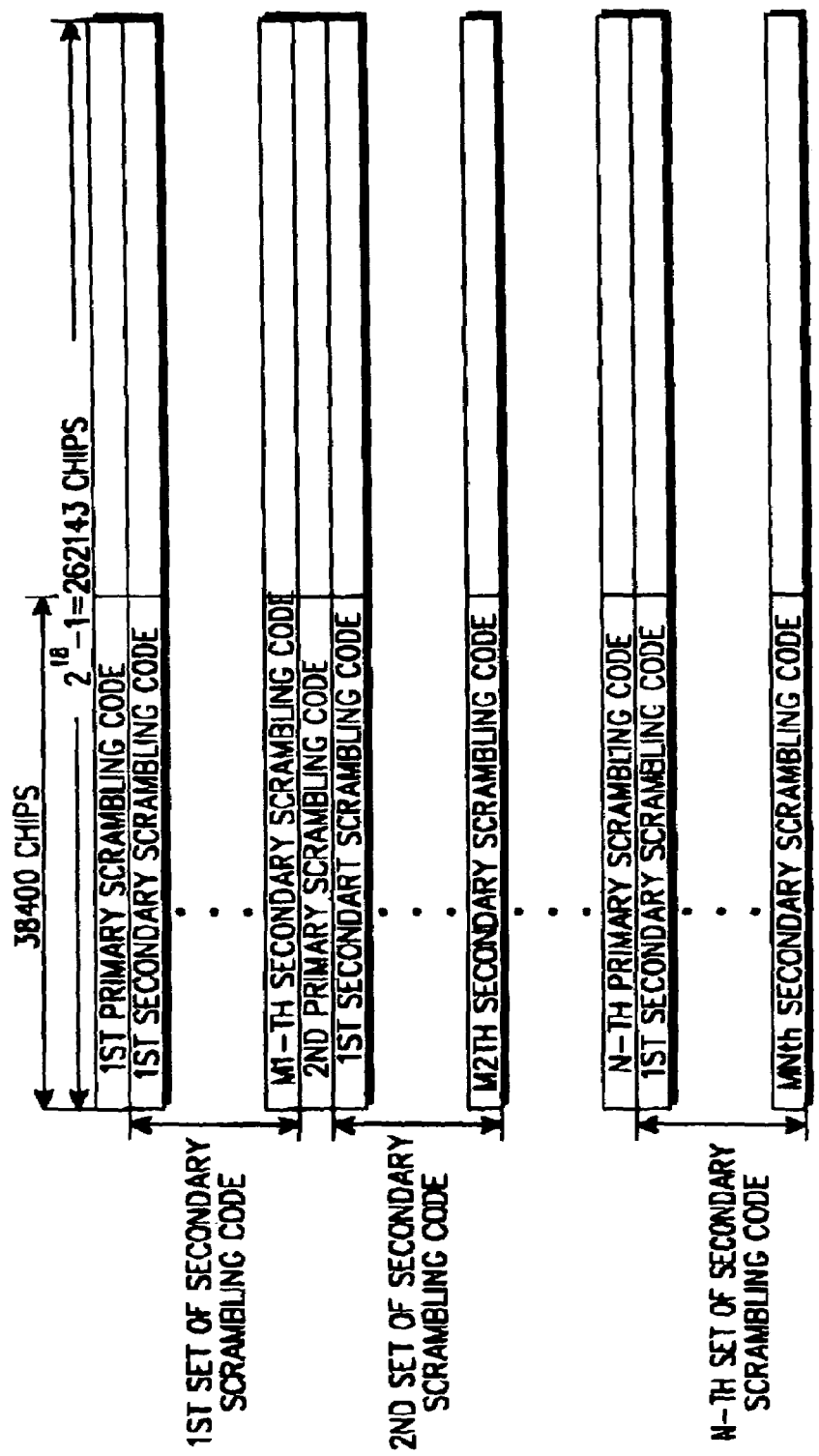
FIG. 9 is a diagram showing the structure of a scrambling code in accordance with a second embodiment of the present invention.

FIG. 9 is a diagram showing the structure of primary and secondary scrambling codes in accordance with a second embodiment of the present invention. While the first embodiment masks both m-sequences $m_1(t)$ and $m_2(t)$ to generate scrambling codes, the second embodiment involves cyclic shift of the m-sequence $m_2(t)$ only other than $m_1(l)$ to generate scrambling sequences. That is, this embodiment is well expressed by Equation 1.

Referring to FIG. 9, when M secondary scrambling codes correspond to one primary scrambling code, the first (M+2)-th, (2M+3)-th, . . . , ((K−1)*M+K)-th, . . . , and (511M+512)-th gold codes are used as primary scrambling codes. The secondary scrambling codes corresponding to the ((K−1)*M+K)-th gold code used as the (K)-th primary scrambling code are composed of M gold codes, i.e., ((K−1)*M+(K+1)), ((K−1)*M+(K+2)) . . . , and (K*M+K)-th gold codes. Here, with 512 primary scrambling codes used, each of the secondary scrambling code sets corresponding to the 512 primary scrambling codes is composed of M secondary scrambling codes. In this structure, if a cell uses one of the primary scrambling codes then secondary scrambling codes belonging to the secondary scrambling code group corresponding to the primary scrambling code will be used when the secondary scrambling codes need to be used. As shown in FIG. 9, once a primary scrambling code is selected, the secondary scrambling codes corresponding to the primary scrambling code are generated by the adding cyclically shifted first m-sequences and the second m-sequence. Here, the secondary scrambling codes are generated through application of mask functions to the sequences in the first shift register memory. This method is adapted to a scrambling code generator of a transmitter as illustrated in FIG. 10, which concurrently generates one primary scrambling code and multiple secondary scrambling codes.

Figure 10:
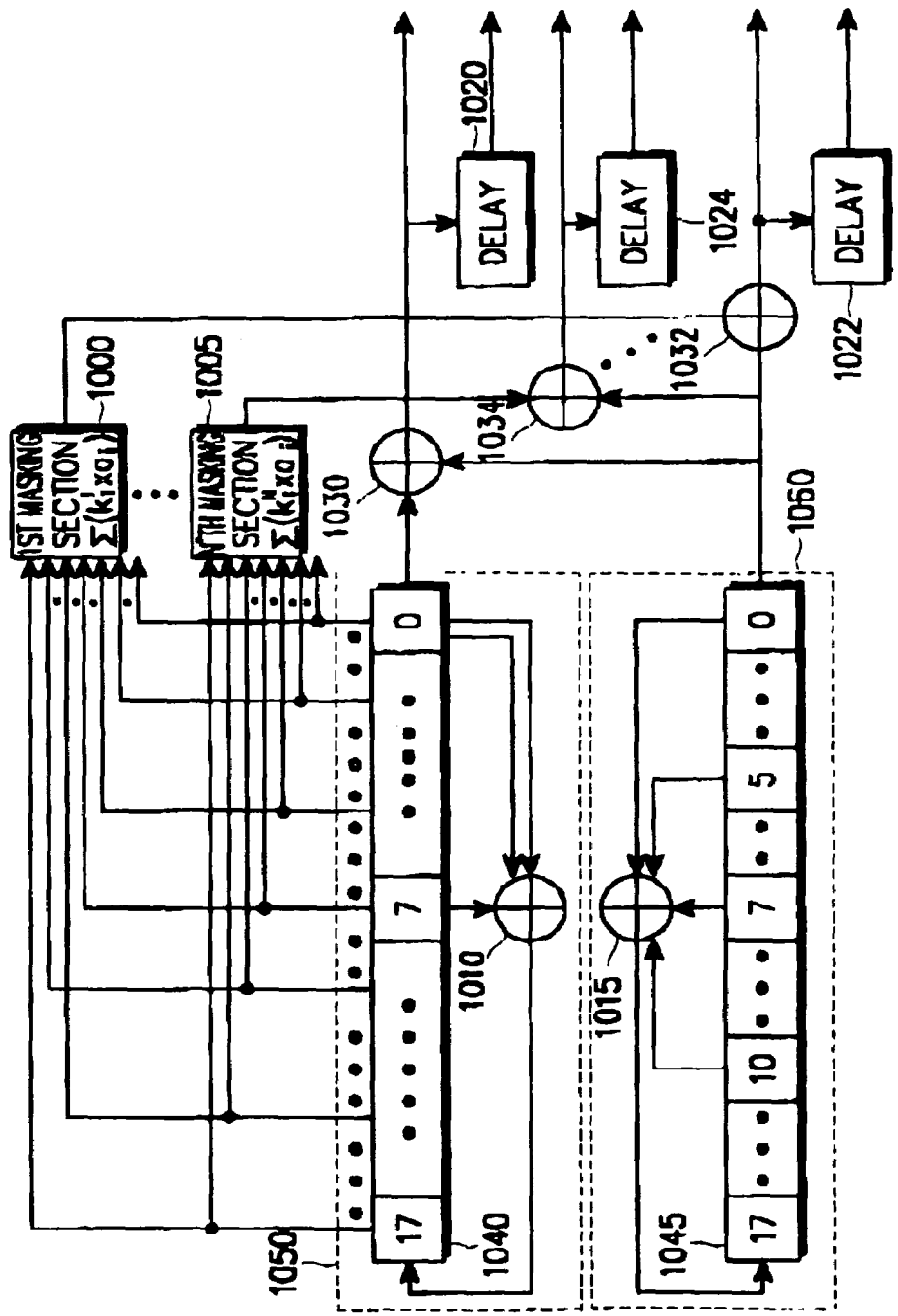
FIG. 10 is a detailed diagram showing the structure of a scrambling code group generator of a downlink transmitter in a UMTS mobile communication system in accordance with the second embodiment of the present invention.

Referring to FIG. 10, the first m-sequence generator 1050 comprises a first shift register memory 1040 (with registers 0 to 17) and an adder 1010 for adding the outputs of the registers 0 and 7. The second m-sequence generator 1060 comprises a second register memory 1045 (with registers 0 to 17) and an adder 1015 for adding the outputs of the registers 0, 5, 7 and 10. The scrambling code generator shown in FIG. 10 comprises the two m-sequence generators 1050 and 1060, a plurality of masking sections 1000 to 1005, a plurality of adders 1032 to 1034 and 1030, and a plurality of delays 1022 to 1024 and 1020. The first shift register memory 1040 stores a predetermined register initial value "$a_0$" and the second shift register memory 1045 stores a predetermined register initial value "$b_0$". The shift register memory 1040 and 1045 can store 18 binary values (bits or symbols) "$a_i$" and "$b_i$" ($0 \leq i \leq 17$). The two m-sequence generators 1050 and 1060 generate respective serial output sequence bits according to each generation polynomials at every period of the input clock (not shown). The second embodiment of the present invention uses a gold code length of 38400 symbols to generate scrambling codes. Thus, the shift register memories 1040 and 1045 may be reset to the initial value when each of the register memories 1040 and 1045 outputs a sequence having a length of 38400 symbols.

The first m-sequence generator 1050 generates the first m-sequence using the register memory 1040 and the adder 1010 which is a binary adder that adds the binary values from the registers 0 and 7 of the register memory 1040 and outputs the sum into the register 17. The register 0 of the register memory 1040 sequentially outputs binary values that form the first m-sequence during every period of the input clock. The masking sections 1000 to 1005 store mask code values ($k^1_i$ to $k^N_i$) for generating cyclical shifts of the first m-sequence by a predetermined number of chips. The cyclical shifts are achieved by multiplying the mask code values by the register value "$a_i$" of the first shift register memory 1040, as expressed in the following equation: $\Sigma(K^L_i \times a_i)$. The resulting values are provided to the adders 1032 to 1034, respectively. In the preferred embodiments of the present invention, each of the mask code values ($k^1_i$ to $k^N_i$) creates a new sequence which is a first m-sequence cyclically shifted 1 to N times. Thus, each of the mask code values is determined by the desired number of cyclical shifting.

The adder 1030 adds the 0-th register values of the first and second shift register memories 1040 and 1045 to generate a scrambling code, which becomes a primary scrambling code. The adders 1032 to 1034 each adds one bit generated from the masking sections 1000 to 1005 to one bit generated from the second shift register memory 1045, respectively, to generate I-channel scrambling code signals. Here, the output from the adder 1030 is used as the primary scrambling code and the scrambling codes output from the adders 1032 to 1034 can be used as secondary scrambling codes that corresponds to the primary scrambling code. The following is an example of possible mask values ($k^1_i$ to $K^n_i$): $k^1_i$=(000000000000000010), $k^2_i$=(000000000000000100), $k^3_i$=(000000000000001000) . . . By controlling the mask values, other primary and secondary codes can be generated. The following example shows how to obtain a necessary mask code to cyclically shift a m-sequence -n- times. In general, divide $x^n$ by the generation polynomial for the m-sequence (i.e., $x^n/f(x)$) and take the remainder of the division to form the mask code. For example, if a mask code that cyclically shifts 31 times is desired, take $x^{31}$ and divide it by $f(x)=x^{18}$to $x^7+1$ the generation polynomial and find the remainder which cannot be divided further. The final remainder is $x^{13}+x^9+x^2$ as shown by the following:

$$x^{31}=x^{13}x^{18}=x^{13}(x^7+1)=x^{20}+x^{13}=x^2x^{18}+x^{13}=x^2(x^7+1)+x^{13}=x^{13}+x^9+x^2$$

The binary sequence corresponding to $x^{13}+x^9+x^2$ is 000010001000000100 which is the mask code needed to cyclically shift the m-sequence 31 times.

The delays 1022 to 1024 and 1020 delay the I-channel signals for a predetermined number of chips to generate Q-channel scrambling code signals.

As described above, the second embodiment of the present invention generate scrambling code groups shown in FIG. 9 and only uses one gold code generator, masking sections 1000 to 1005 and adders 1022 to 1034.

Now, a description will be given to an operation of the present invention as constructed above.

Once an initial value for the primary scrambling code is applied to the first and second shift register memories 1040 and 1045 each having 18 registers, the 0-th register values of the first and second shift register memories 1040 and 1045 are fed into the adder 1030 and the 18 register values "$a_i$" of the shift register memory 1040 are fed into the first to N-th masking sections 1000 to 1005 in order to generate 1 to N cyclically shifted sequences of the first m-sequence. Then, the first masking section 1000 masks the input value($a_i$) from the first (upper) shift register memory 1040 with a mask function $k^1_i$ for generating the first secondary scrambling codes (i.e., $\Sigma(k^1_i \times a_i)$) and outputs the masked value($a_i$) to the adder 1032. The N-th masking section 1005 masks the input value($a_i$) from the first (upper) shift register memory 1040 with a mask function $k^N_i$ for generating the N-th secondary scrambling codes (i.e., $\Sigma(k^N_i \times a_i)$) and outputs the masked values to the adder 1034. At the same time, the adder 1030 sums the output bits from the 0-th registers of the first and second shift register memories 1040 and 1045. The generated output signals are immediately delayed at the delay 1020. The adder 1032 sums the output bits from the first masking section 1000 and the 0-th shift register of the second shift register memory 1045. The output signals are immediately fed into the delay 1022. Thereafter, the 0-th and seventh register values of the shift register memory 1040 are added at the adder 1010 and the adder 1010 outputs the sum to the seventeenth register, as the left-sided values are shifted to the right side by one and the utmost left-sided register is newly filled with the output value of the adder 1010. The 0-th, fifth, seventh and tenth register values of the shift register memory 1045 are added at the adder 1015, and the adder inputs the sum into the seventeenth register of the register memory 1045 as the left-sided values are shifted to the right side by one to fill the utmost left-sided register (i.e., the seventeenth register) with the output value of the adder 1015. This procedure is repeated to generate multiple scrambling codes.

Figure 11:
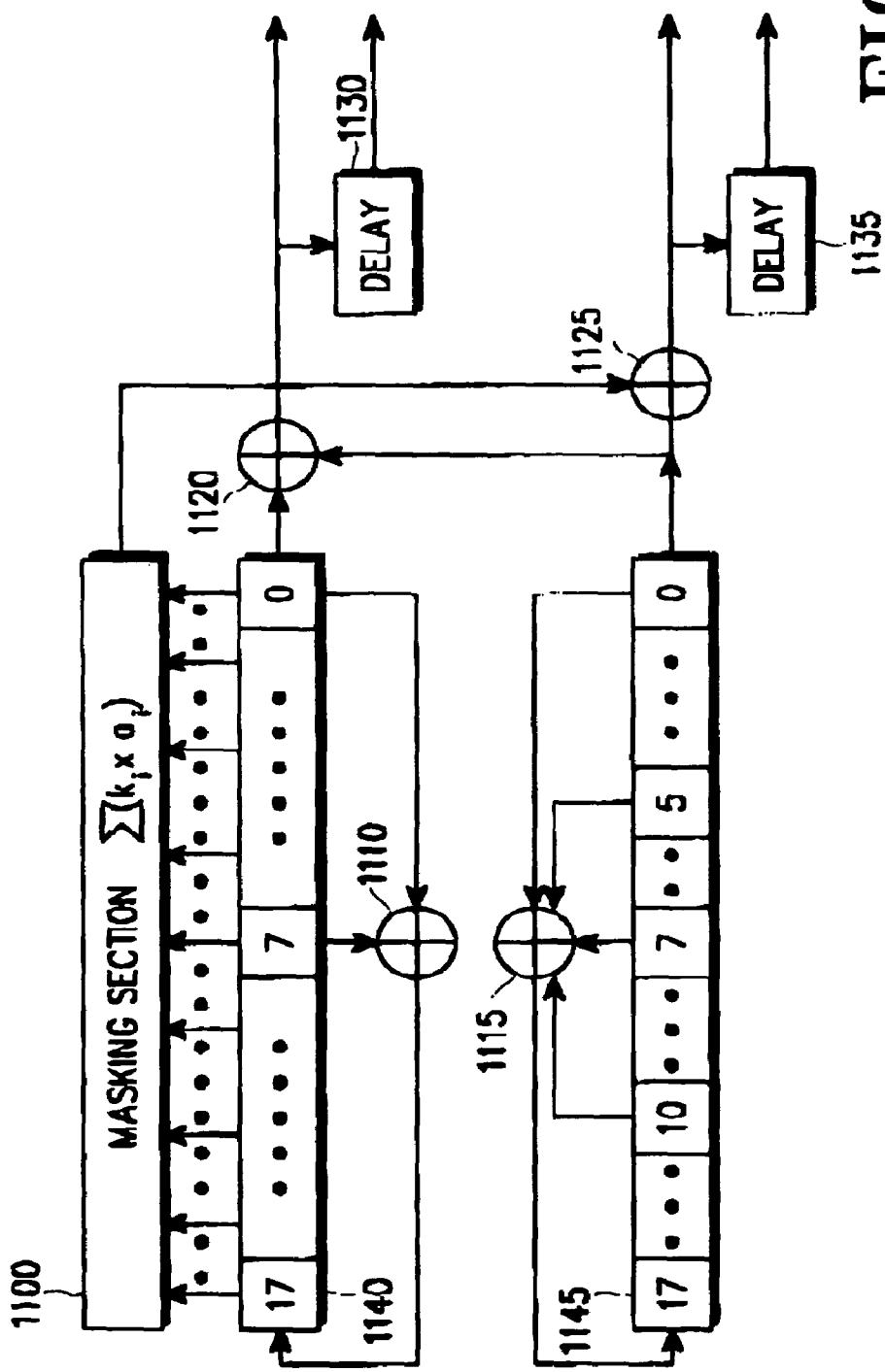
FIG. 11 is a detailed diagram showing the structure of a scrambling code group generator of a downlink receiver in a UMTS mobile communication system in accordance with the second embodiment of the present invention.

FIG. 11 is a diagram showing a scrambling code generator of a receiver for concurrently generating one primary scrambling code and one secondary scrambling code. The embodiments shown in FIGS. 10 and 11 can be used either in a transmitter or a receiver.

The receiver according to the second embodiment of the present invention has only to use one secondary scrambling code and thus needs only one masking section 1100.

Referring to FIG. 11, once an initial value for the primary scrambling code is applied to a first shift register memory 1140 having 18 registers and a second shift register memory 1145 with 18 registers-, the 0-th register values of the first and second shift register memories 1140 and 1145 are fed into an adder 1120. The 18 register values "$a_i$" of the first shift register memory 1140 are fed into the masking section 1100 in order to generate a cyclically shifted m-sequence. Then, the masking section 1100 masks the input values($a_i$) from the register memory 1140 with a mask values $k^i$ for generating the first secondary scrambling codes (i.e., $\Sigma(k_i \times a_i)$) and outputs the masked values to an adder 1125. The adder 1120 sums the output bits from the 0-th registers of the first and second shift register memories 1140 and 1145. The output signals of the adder 1120 are immediately delayed at a delay 1130. Meanwhile, the adder 1125 sums the output bits from the masking section 1100 and the 0-th shift register of the second shift register memory 1145 and outputs the sum to a delay 1135 immediately. Then, the 0-th and seventh register values of the first shift register memory 1140 are added at the adder 1110, in which case the left-sided values are shifted to the right side by one and the utmost left-sided register is newly filled with the output value of the summer 1110. The 0-th, fifth, seventh and tenth register values of the second shift register memory 1145 are added at the adder 1115, shifting the left-sided values to the right side by one and newly filling the utmost left-sided register with the output value of the adder 1115. The mask values can be controlled by a controller_(not shown) when the receiver needs to generate other scrambling codes.

The scrambling code generator of the second embodiment needs mask values stored in the masking section in order to generate the secondary scrambling code, i.e., it uses N mask values to generate N scrambling codes. Accordingly, the structure of primary and secondary scrambling codes shown in FIG. 9 enables implementation of the scrambling code generator of the transceiver structure shown in FIGS. 10 and 11, which further includes only N mask functions with a quite little hardware complexity to generate multiple scrambling codes.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for generating a primary scrambling code, the method comprising the steps of:
   generating a first m-sequence from a first m-sequence generator including first shift registers having first shift register values $a_i$, wherein i=0 to c−1 and where c is the total number of the registers;
   generating a second m-sequence from a second m-sequence generator including second shift registers having values $b_j$, wherein j=0 to c−1, and where c is the total number of the registers;
   masking the first shift register values $a_i$ with a first set or mask values $K_i$, wherein i=0 to c−1 to generate a third m-sequence;
   adding the first m-sequence with the second m-sequence to generate a primary scrambling code; and
   adding the third m-sequence and the second m-sequence to generate a secondary scrambling code;
   wherein, the masking step shifts the first m-sequence cyclically by L chips to generate an $L^{th}$ secondary scrambling code associated with the primary scrambling code.

2. The method of claim 1, wherein the primary scrambling code is one of a plurality primary scrambling codes and a $K^{th}$ primary scrambling code is a $((K-1)*M+K)^{th}$ gold code, where M is a total number of secondary scrambling codes per primary scrambling code and 1<K<512.

3. The method of claim 1, wherein the secondary scrambling codes associated with a $K^{th}$ primary scrambling code are from $((K-1)*M+K+1)^{th}$ to $(K*M+K)^{th}$ gold codes, where M is a total number of secondary scrambling codes per primary scrambling code and 1<K<512.

4. The method of claim 1, wherein 1<L<M, where M is a total number of secondary scrambling codes per primary scrambling code.

5. The method of claim 1, wherein the masking step is expressed by $\Sigma(k_i \times a_i)$.

6. The method of claim 1, further comprising:
   masking the first shift register values $a_i$ with a second set of mask values $K_j$ to generate a fourth m-sequence, wherein j=0 to c−1; and
   adding the fourth m-sequence and the second m-sequence to generate an $N^{th}$ secondary scrambling code associated with the primary scrambling code;
   wherein, the masking step shifts the first m-sequence cyclically by N chips to generate an $N^{th}$ secondary scrambling code.

7. The method of claim 6, wherein 1<N<M, where M is a total number of secondary scrambling codes per primary scrambling code.

8. The method of claim 1, further comprising the step of delaying at least one of the primary scrambling code and secondary scrambling code to produce a Q-channel component, wherein the primary scrambling code and secondary scrambling code are I-channel components.

9. A scrambling code generator, comprising:
   a first m-sequence generator to generate a first m-sequence by using a plurality of first registers with first shift register values $a_i$, wherein i=0 to c−1 and where c is the total number of the first registers;
   a second m-sequence generator to generate a second m-sequence by using a plurality of second registers with second shift register values $b_j$, wherein j=0 to c−1 and where c is the total number of second registers;
   a masking section to mask the first shift register values $a_i$ with a first set of mask values $K_i$ to generate a third m-sequence, wherein i=0 to c−1 to generate a third m-sequence;
   a first adder to add the first m-sequence and the second m-sequence to generate a primary scrambling code; and
   a second adder to add the third m-sequence and the second m-sequence to generate a secondary scrambling code,
   wherein the masking section shifts the first m-sequence cyclically by L chips to generate an $L^{th}$ secondary scrambling code associated with the primary scrambling code.

10. The scrambling code generator of claim 9, wherein the primary scrambling code is one of a plurality of primary scrambling codes and a $K^{th}$ primary scrambling code is a $((K-1)*M+K)^{th}$ gold code, where M is a total number of secondary scrambling codes per primary scrambling code and 1<K<512.

11. The scrambling code generator of claim 10, wherein the secondary scrambling codes associated with the $K^{th}$ primary scrambling code are $((K-1)*M+K+1)^{th}$ to $(K*M+K)^{th}$ gold codes.

12. The scrambling code generator of claim 9, further comprising:
   a second masking section to mask the first shift register values $a_i$, with a second set of mask values $K_j$, wherein j=0 to c−1, to generate a fourth m-sequence; and
   a third adder to add the fourth m-sequence and the second m-sequence to generate an N-th secondary scrambling code associated with the primary scrambling code,
   wherein the second masking section shifts the first m-sequence cyclically by N chips to generate the $N^{th}$ secondary scrambling code.

13. The scrambling code generator of claim 9, wherein the masking section shifts the first m-sequence cyclically by masking the first shift register values $a_i$ in accordance with $\Sigma(K_i \times a_i)$.

14. The scrambling code generator of claim 9, wherein the first m-sequence generator cyclically shifts the first shift register values and the second m-sequence generator cyclically shifts the second shift register values.

15. The scrambling code generator of claim 9, wherein the first m-sequence generator adds predetermined shift register values of the first shift registers based on a first generating polynomial of the first m-sequence, right shifts the first shift register values $a_i$ of the first shift registers, and replaces the first register value $a_{c-1}$ with the result of the addition of the predetermined register values.

16. The scrambling code generator of claim 9, wherein the first m-sequence generator adds a first shift register value $a_0$ with a first shift register $a_7$ to form a next first shift register $a_{c-1}$.

17. The scrambling code generator of claim 9, wherein the second m-sequence generator adds predetermined shift register values of the second shift registers based on a second generating polynomial of the second m-sequence, right shifts the second shift register values $b_j$ of the second shift registers, and replaces the second register value $b_{c-1}$ with the result of the addition of the predetermined register values.

18. The scrambling code generator of claim 9, wherein the second m-sequence generator adds a second shift register value $b_0$ with a second shift register value $b_5$, $b_7$, and a second shift register value $b_{10}$ to form a next second shift register value $b_{c-1}$.

19. The apparatus of claim 9, further comprising a means for delaying at least one of the primary scrambling code and the secondary scrambling code to produce Q-channel component, wherein the primary scrambling code and the secondary scrambling code are I-channel components.

20. A method for generating scrambling codes in mobile communication system having a scrambling code generator, the method comprising the steps of:
    generating a $((K-1)*M+K)^{th}$ gold code as a $K^{th}$ primary scrambling code, where K is a natural number and M is a total number of secondary scrambling codes per one primary scrambling code; and
    generating $((K-1)*M+K+1)^{th}$ through $(K*M+K)^{th}$ gold codes as secondary scrambling codes associated with the $K^{th}$ primary scrambling code,
    wherein an $L^{th}$ Gold code is generated by adding an (L-1)-times shifted first m-sequence and a second m-sequence.

21. The method as claimed in claim 20, wherein K is a primary scrambling code number and $1 \leq K \leq 512$.

22. The method as claimed in claim 21, wherein the first m-sequence is generated from a first shift register memory having a plurality of first shift registers with first shift register values $a_i$, wherein i=0 to c−1 and where c is the total number of the first registers and the (L−1)-times shifted first m-sequence is generated by masking the first shift register values $a_i$ with mask values $K_i$, where i=0 to c−1.

23. The method as claimed in claim 22, wherein the masking is performed according to: $\Sigma(K_i \times a_i)$.

24. The method as claimed in claim 20, wherein the generated primary scrambling code and secondary scrambling code are I-channel components and the method further comprises delaying at least one of the primary scrambling code and secondary scrambling code to produce Q-channel components.

25. An apparatus for generating scrambling codes in mobile communication system having a scrambling code generator, comprising:

a first m-sequence generator to generate a first m-sequence;
    a second m-sequence generator to generate a second m-sequence; and
    at least one adder for generating a $((K-1)*M+K)^{th}$ Gold code as a $K^{th}$ primary scrambling code by adding a $(((K-1)*M+K)-1)$-times shifted first m-sequence and the second m-sequence,
    wherein K is a natural number and M is a total number of secondary scrambling codes per one primary scrambling code.

26. The apparatus of claim 25, wherein the secondary scrambling codes of the $K^{th}$ primary scrambling codes are the $((K-1)*M+K+1)^{th}$ through $(K*M+K)^{th}$ Gold codes.

27. The apparatus as claimed in claim 26, wherein K is a primary scrambling code number and $1 \leq K \leq 512$.

28. The apparatus as claimed in claim 25, wherein the first m-sequence generator comprises a plurality of first registers with first shift register values $a_i$, wherein i=0 to c−1 and where c is the total number of the first shift registers, and the scrambling code generator further comprising at least one masking section for generating the n-times shifted first m-sequence by masking the first shift register values $a_i$ with mask values $K_i$, where i=0 to c−1.

29. The apparatus as claimed in claim 28, wherein the masking is performed according to: $\Sigma(K_i \times a_i)$.

30. The apparatus as claimed in claim 25, wherein the primary scrambling code and secondary scrambling code are I-channel components and the apparatus further comprises a means for delaying at least one of the primary scrambling codes and secondary scrambling code to produce Q-channel components.

31. A method for generating scrambling codes in mobile communication system having a scrambling code generator, comprising the steps of:
    generating a first m-sequence;
    generating a second m-sequence; and
    generating a $((K-1)*M+K)^{th}$ Gold code as a $K^{th}$ primary scrambling code by adding a $(((K-1)*M+K)-1)$-times shifted first m-sequence and the second m-sequence,
    wherein K is a natural number and M is a total number of secondary scrambling codes per one primary scrambling code.

32. The method as claimed in claim 31, further comprising generating $((K-1)*M+K+1)^{th}$ to $(K*M+K)^{th}$ Gold codes as secondary scrambling codes corresponding to the $K^{th}$ primary scrambling code.

33. The method as claimed in claim 31, wherein K is a primary scrambling code number and $1 \leq K \leq 512$.

34. The method as claimed in claim 31, wherein the first m-sequence is generated from a first shift register memory having a plurality of first shift registers with first shift register values $a_i$, wherein i=0 to c−1 and where c is the total number of the first registers and the n-times shifted first m-sequence is generated by masking the first shift register values $a_i$ with mask values $K_i$, where i=0 to c−1.

35. The method as claimed in claim 34, wherein the masking is performed according to: $\Sigma(K_i \times a_i)$.

36. The method as claimed in claim 31, wherein each scrambling code is used as an I-channel component and a Q-channel component, corresponding to the I-channel component, is generated by delaying the I-channel component for a predetermined time.

* * * * *